US010410924B2

(12) United States Patent
Karasaki et al.

(10) Patent No.: US 10,410,924 B2
(45) Date of Patent: Sep. 10, 2019

(54) MANUFACTURING PROCESS OF ELEMENT CHIP

(71) Applicant: Panasonic Intellectual Property Management Co., Ltd., Osaka (JP)

(72) Inventors: Hidehiko Karasaki, Osaka (JP); Hidefumi Saeki, Osaka (JP); Atsushi Harikai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/860,827

(22) Filed: Jan. 3, 2018

(65) Prior Publication Data

US 2018/0197777 A1    Jul. 12, 2018

(30) Foreign Application Priority Data

Jan. 12, 2017   (JP) ................................. 2017-003671
Feb. 8, 2017    (JP) ................................. 2017-021468

(51) Int. Cl.
*H01L 21/78*     (2006.01)
*H01L 23/544*    (2006.01)
(Continued)

(52) U.S. Cl.
CPC ............ *H01L 21/78* (2013.01); *B23K 26/062* (2015.10); *B23K 26/359* (2015.10);
(Continued)

(58) Field of Classification Search
CPC ........................... H01L 21/82; H01L 21/3065
See application file for complete search history.

(56) References Cited

U.S. PATENT DOCUMENTS 9,177,861 B1 * 11/2015 Park ...................... H01L 21/78
9,349,648 B2    5/2016 Lei et al.
(Continued)

FOREIGN PATENT DOCUMENTS

JP    2009-021476 A    1/2009
JP    2013-149900 A    8/2013
(Continued)

OTHER PUBLICATIONS

Japanese Office Action issued in Japanese Patent Application No. JP2017-003671 dated Jan. 8, 2019.

*Primary Examiner* — Farun Lu
(74) *Attorney, Agent, or Firm* — Pearne & Gordon LLP

(57) ABSTRACT

Provided is a manufacturing process of an element chip, which comprises a preparation step for preparing a substrate including a semiconductor layer having first and second sides and a wiring layer on the first side thereof, the substrate having a plurality of dicing regions and element regions defined by the dicing regions, a scribing step for radiating a laser beam towards the first side of the wiring layer onto the dicing regions to form apertures exposing the semiconductor layer along the dicing regions, and a dicing step for dicing the substrate along the apertures into a plurality of the element chips, wherein the laser beam has a beam profile having a M-shaped distribution whose peripheral intensity is greater than a central intensity in a width direction of the laser beam along the dicing regions.

7 Claims, 12 Drawing Sheets

(51) Int. Cl.
    *H01L 21/268* (2006.01)
    *H01L 21/3065* (2006.01)
    *H01L 21/02* (2006.01)
    *B23K 26/359* (2014.01)
    *H01L 21/82* (2006.01)
    *H01L 21/67* (2006.01)
    *H01L 21/683* (2006.01)
    *B23K 26/062* (2014.01)
    *H01J 37/32* (2006.01)
    *B23K 103/00* (2006.01)

(52) U.S. Cl.
    CPC ...... *H01L 21/02076* (2013.01); *H01L 21/268* (2013.01); *H01L 21/3065* (2013.01); *H01L 21/67103* (2013.01); *H01L 21/67109* (2013.01); *H01L 21/6831* (2013.01); *H01L 21/82* (2013.01); *H01L 23/544* (2013.01); *B23K 2103/56* (2018.08); *H01J 37/321* (2013.01); *H01J 2237/334* (2013.01); *H01L 2223/5446* (2013.01)

(56) References Cited

U.S. PATENT DOCUMENTS

| | | |
|---|---|---|
| 9,355,907 B1 | 5/2016 | Lei et al. |
| 2009/0017600 A1 | 1/2009 | Kirihara et al. |
| 2013/0267076 A1 | 10/2013 | Lei et al. |
| 2016/0027697 A1* | 1/2016 | Lei ................. H01L 21/0337 |
| | | 438/463 |
| 2017/0256500 A1* | 9/2017 | Park ................. B23K 26/0624 |

FOREIGN PATENT DOCUMENTS

| | | |
|---|---|---|
| JP | 2015-519732 A | 7/2015 |
| JP | 2015-220240 A | 12/2015 |

\* cited by examiner

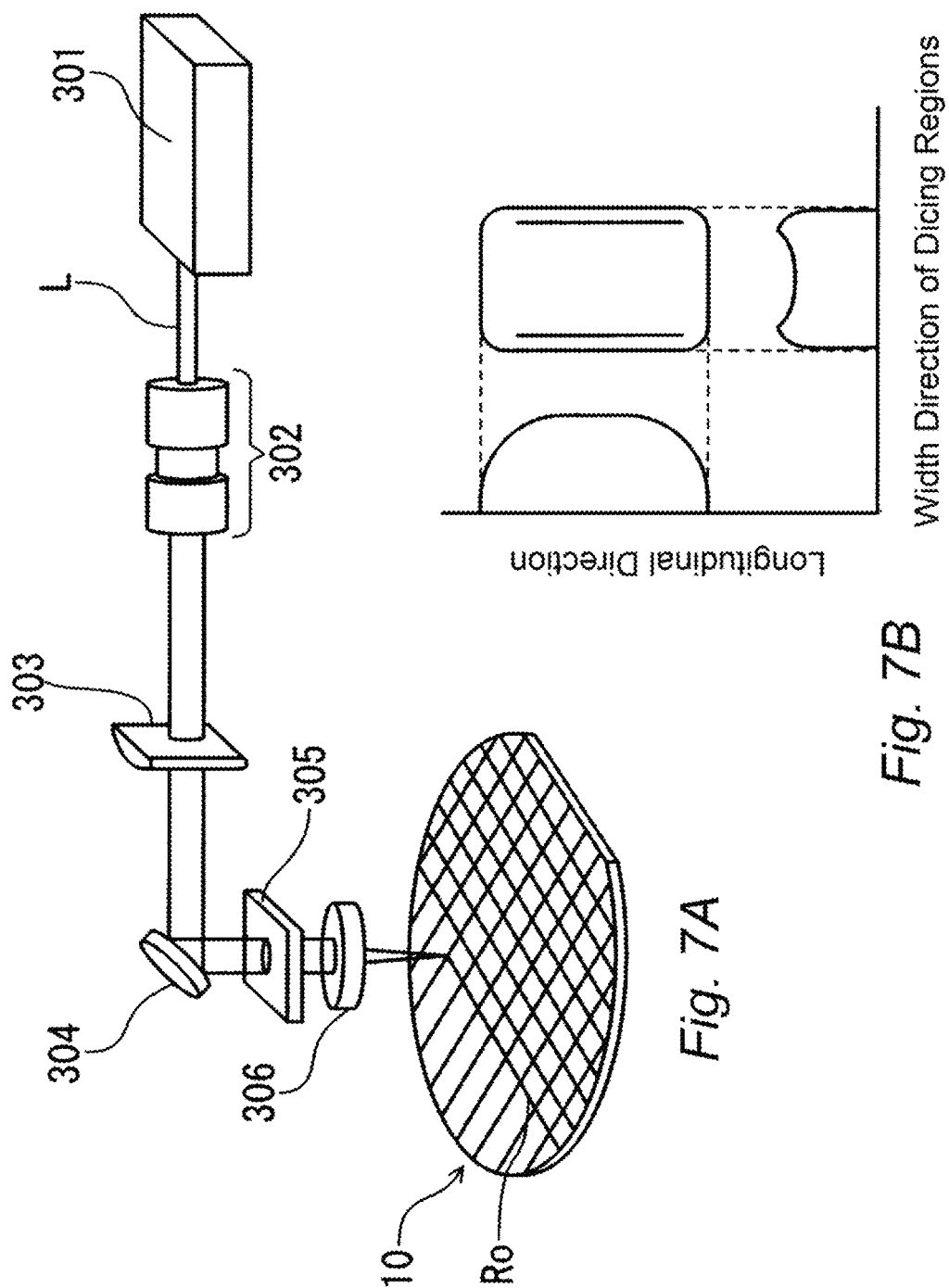

MANUFACTURING PROCESS OF ELEMENT CHIP

CROSS REFERENCE TO RELATED APPLICATION

The present application is based on and claims priority under 35 U.S.C. § 119 with respect to the Japanese Patent Application No. 2017-003671 filed on Jan. 12, 2017, and the Japanese Patent Application No. 2017-021468 filed on Feb. 8, 2017 of which entire contents are incorporated herein by reference into the present application.

TECHNICAL FIELD

The present invention relates to a manufacturing process of an element chip, which includes a step for dicing a substrate having a semiconductor layer by a plasma exposure.

BACKGROUND

A process for dicing a semiconductor wafer having a plurality of integrated circuits has been suggested, which includes a step for forming a protective layer covering the integrated circuits of the semiconductor wafer, a step for patterning gaps on the protective layer to form a mask thereon, and a step for etching the semiconductor wafer through the gaps. For example, Patent Document 1 (JP 2015-519732 A or US 2013/267076 A1) suggests the step for patterning gaps on the protective layer by a multi-step laser scribing process with a laser beam having a Gaussian beam pass or a top hat beam pass.

Recently, a plasma etching process has been established as a process for dicing the substrate having a wiring layer and a semiconductor layer into a plurality of element chips, in which a plurality of groove-like apertures (gaps, which may also be referred as streets) are formed in dicing regions of wiring layers, and the semiconductor layer is etched along the apertures by the plasma exposure onto the semiconductor layer uncovered by the protective layer. When laser-scribing the dicing regions with the Gaussian beam pass or the top hat beam pass as proposed by Patent Document 1, the semiconductor layer is damaged on bottom surfaces around a center of the apertures, a material of the wiring layer is melted, and the melted material is trapped and re-solidified in damaged portions on the surfaces of the semiconductor layer. On the other hand, when laser-scribing the dicing regions with the laser beam having reduced intensity, the energy density at peripheral portions of the laser beam is insufficient such that side walls to be formed along both sides of the wiring layer have tapered angle less than the expected one, resulting in insufficient verticality of the side walls.

SUMMARY

The first aspect of the present invention relates to a manufacturing process of an element chip, which comprises a preparation step for preparing a substrate including a semiconductor layer having first and second sides and a wiring layer on the first side thereof, the substrate having a plurality of dicing regions and element regions defined by the dicing regions, a scribing step for radiating a laser beam towards the first side of the wiring layer onto the dicing regions to form apertures exposing the semiconductor layer along the dicing regions; and a dicing step for dicing the substrate along the apertures into a plurality of the element chips, wherein the laser beam has a beam profile having a M-shaped distribution whose peripheral intensity is greater than a central intensity in a width direction of the laser beam along the dicing regions.

The second aspect of the present invention relates to a manufacturing process of an element chip, which comprises a preparation step for preparing a substrate including a semiconductor layer having first and second sides and a wiring layer on the first side thereof, the substrate having a plurality of dicing regions and element regions defined by the dicing regions, a scribing step for radiating a laser beam towards the first side of the wiring layer onto the dicing regions to form apertures exposing the semiconductor layer along the dicing regions, and a dicing step for dicing the substrate along the apertures into a plurality of the element chips, wherein the wiring layer includes a circuit layer and a resin layer for protecting a surface of the circuit layer, wherein the resin layer is scribed by radiating a first laser beam and the circuit layer is scribed by radiating a second laser beam, wherein the first laser beam has a beam profile having a M-shaped distribution whose peripheral intensity is greater than a central intensity in a width direction of the first laser beam along the dicing regions, and wherein the second laser beam has a beam profile having a distribution selected from a group consisting of a Gaussian distribution and a top hat distribution, in a direction crossing the width direction of the laser beam along the dicing regions.

BRIEF DESCRIPTION OF THE DRAWINGS

FIG. 7A is a conceptual view depicting an exemplary apparatus for radiating the laser beam onto the substrate, and FIG. 7B is a schematic view illustrating cross-sectional spot shapes of an laser beam.

DETAILED DESCRIPTION

First Embodiment

A manufacturing process of an element chip according to a first embodiment of the present invention comprises a preparation step for preparing a substrate which includes a semiconductor layer having first and second sides, and a wiring layer formed on the first side of the semiconductor layer. The substrate includes a plurality of element regions and a plurality of dicing regions (streets) defining each of the element regions. The wiring layer may include a circuit layer and a resin layer for protecting a surface of the circuit layer. Typically, the circuit layer contains a metal material, and the resin layer contains a resin material. The dicing regions are defined on the first side of the substrate in a predetermined linear pattern.

The semiconductor layer may be formed of silicon (Si), gallium arsenide (GaAs), gallium nitride (GaN), or silicon carbide (SiC), for example.

The wiring layer typically includes the circuit layer and the resin layer for protecting the surface of the circuit layer. The circuit layer may contain, for example, a low-k (low-dielectric) material, a copper (Cu) wiring layer, a metal material, an insulating layer such as a silicon dioxide ($SiO_2$) layer or a silicon nitride ($Si_3N_4$) layer, lithium tantalate ($LiTaO_3$), and lithium niobate ($LiNbO_3$). The resin layer may contain a thermosetting resin such as polyimide, a photoresist such as a phenol resin, and a water-soluble resist such as an acrylic resin.

The manufacturing process of the element chip comprises a scribing step for forming apertures (gaps) exposing the semiconductor layer along the dicing regions by radiating a laser beam towards the first side onto the dicing regions of the wiring layer. Typically, the apertures are formed along the linear dicing regions in a configuration of grooves. The narrower apertures of the grooves are more desirable for a better productivity of the element chips from the substrate. As a verticality of the side walls of the wiring layers along both sides of the apertures is better improved, the narrower apertures of the grooves can more easily be formed.

In the scribing step, the laser beam is radiated onto the resin layer and the circuit layer. The laser beam has a beam profile having a M-shaped distribution whose peripheral intensity is greater than a central intensity at least in a width direction of the laser beam along the dicing regions. In the present application, the beam profile in the width direction along the dicing region is referred to as a "width profile". Thus, the width profile depicts a beam intensity distribution in a cross section of the laser beam taken along the width direction of the dicing region. Also, the width direction of the dicing region corresponds to the width direction of the groove-like apertures (gaps), which is perpendicular to a longitudinal direction of the streets.

Figure 1:
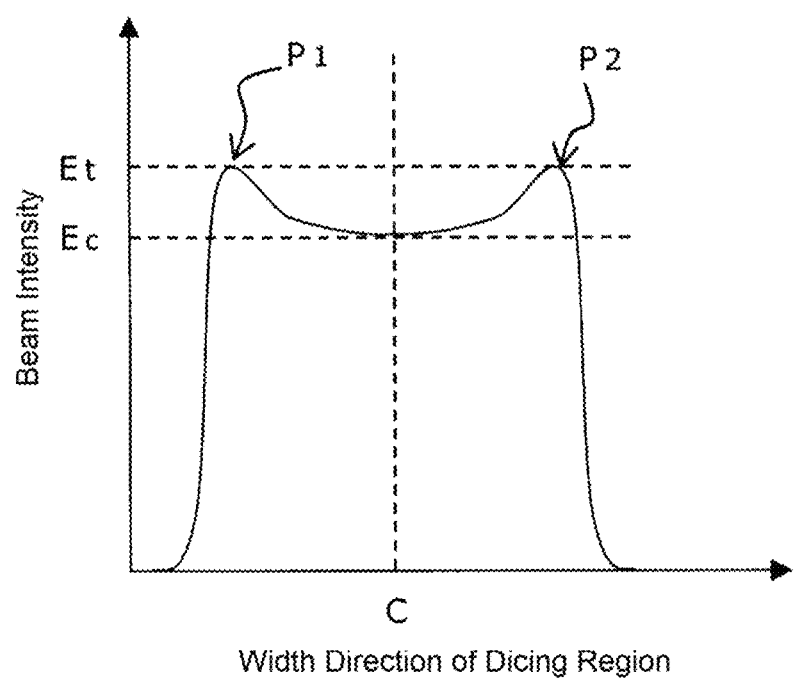
FIG. 1 is a schematic chart of a profile of a laser beam having a M-shaped distribution in a width direction.

FIG. 1 is a conceptual view depicting the width profile having the M-shaped distribution of the laser beam. The horizontal axis depicts a position of the dicing region in the width direction, and the vertical axis depicts an optical intensity (energy density) of the laser beam. The central intensity of the width profile in the dicing region is shown as the intensity Ec at the central position. The peripheral intensity of the width profile is shown as the intensity Et of a pair of maximal peaks P1 and P2 positioned at both ends of the width profile with the central position therebetween.

The laser beam having the M-shaped distribution in the width profile may be configured by shaping the laser beam having a Gaussian distribution in the width profile. The laser beam shaped to have the M-shaped distribution in the width profile may have the central intensity which is half or less, or one-thirds or less than that of the pre-shaped laser beam having the Gaussian distribution in the width profile. The peripheral intensity of the M-shaped distribution is greater than that of the Gaussian distribution. This prevents the surface of the semiconductor layer positioned beneath the wiring layer, and improves a verticality of side walls of the wiring layer to be formed along both sides of the apertures.

The laser beam having the M-shaped distribution in the width profile may be shaped by means of a modified version of an optical system commonly used for shaping the laser beam to have the Gaussian distribution in the width profile. The laser beam having the Gaussian distribution in the width profile may be shaped, for example, by radiating the laser beam having a beam diameter greater than a designed value of the Gaussian distribution to a Diffractive Optical Element (DOE) or an aspherical beam shaper. The DOE or the aspherical beam shaper may preferably be arranged just before the collecting lens to maintain a processing accuracy. Also, the laser beam having the Gaussian distribution in the width profile may be shaped through a cylindrical lens and an aspherical lens to have various configurations, including for example, the M-shaped distribution in the width direction and a top hat distribution in a progressing or longitudinal direction.

The laser beam having the M-shaped distribution in the width profile may preferably have substantially the same intensity at two of the maximal peaks P1 and P2 on both sides thereof, as shown in FIG. 1. When there is a difference between the intensity at the maximal peaks P1 and P2, the difference therebetween is preferably 10% of an average of the intensity thereof. Also, the peripheral intensity Et preferably is 105% or more, and more preferably 110% or more than the central intensity Ec, thereby to emphasize the advantage due to the laser beam having the M-shaped distribution in the width profile.

Meanwhile, the laser beam having the width profile of the top hat distribution may be referred to one having almost the same intensity across the width of the dicing region, and the peripheral intensity (at shoulder regions where the intensity is rapidly decreasing) may be almost the same as the central intensity, for example, between about 90% and about 98%.

According to the scribing step of the present embodiment, a taper angle of the side walls of the wiring layer to be formed along both sides of the apertures (which is an acute angle between the first or second side and the side walls) can be increased, thereby improving the verticality of the side walls. Thus, the quality of the apertures to be formed in the wiring layer is improved, which in turn allows the element chip of high quality to be formed in the subsequent dicing step.

After the scribing step, the dicing step may be implemented by a plasma exposure (a first plasma exposure) onto the substrate. While the element regions of the semiconductor layer are masked by the wiring layer, the dicing regions of the semiconductor layer uncovered by the apertures are etched by the plasma exposure. This allows the substrate to be divided into a plurality of element chips each having an element region.

When the side walls of the wiring layer along both sides of the apertures are formed to have a less sufficient verticality, the plasma etching step to the semiconductor layer may disorganize or disorder the side walls of the element chips to be formed, and may likely reduce a deflecting strength thereof. However, the quality of the apertures may be enhanced by improving the verticality of the side walls of the wiring layer so that the side walls of the semiconductor layer to be etched through the plasma etching step are well organized, thereby produce high-quality element chips of a high deflecting strength. Furthermore, the higher verticality of the side walls of the wiring layer allows the narrower (or smaller) groove-like apertures, thereby reducing a useless margin (dead space) of the substrate.

When the plasma etching is applied in the dicing step, it is necessary to pay attention to a contamination on the bottoms in the apertures or the grooves. For example, when the circuit layer is covered by the resin layer and the laser beam having the Gaussian distribution or the top hat distribution with limited intensity is applied to prevent the processing damage to the semiconductor layer, the energy density at peripheral portions of the laser beam is insufficient to fully ablate the resin layer, causing the resin fluidified and agglomerated due to a surface tension, which are likely adhered as resin balls to the peripheral edges on the bottoms of the apertures.

The resin balls provide no adverse impact on a mechanical dicing step of the semiconductor layer by means of a blade cutter, for example. However, when the semiconductor layer is etched by the plasma exposure, the resin balls interfere a reaction between the semiconductor layer and a plasma atmosphere, substantially influencing the quality of the element chips.

In the meanwhile, the laser beam having the M-shaped distribution in the width direction along the dicing regions have the sufficient energy density at peripheral portions thereof so as to reduce the central intensity of the laser beam and eliminate or substantially reduce the resin balls at the peripheral edges of the apertures. Thus, the M-shaped distribution of the laser beam increases the beam intensity at the peripheral portions thereof enough to ablate the resin layer close to the side walls in the apertures, and reduces the central intensity appropriately. Therefore, the scribing step can be implemented, while preventing the semiconductor layer positioned beneath the wiring layer, improving the verticality of the side walls in the apertures, and eliminating or substantially reducing the resin balls at the peripheral edges of the apertures even in case that the wiring layer contains the resin layer.

Figure 2A:
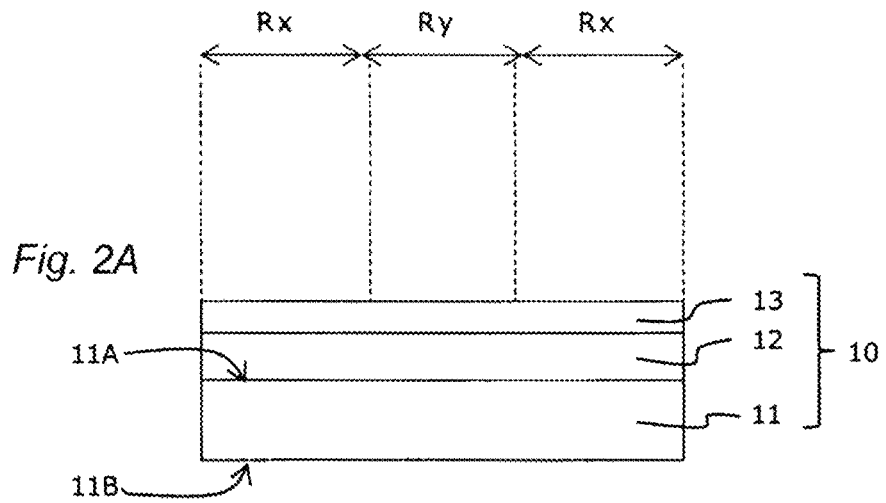
FIGS. 2A-2C are schematic cross-sectional views illustrating a preparation step of a manufacturing process of an element chip by radiating a laser beam having a M-shaped distribution in the width direction, illustrating the substrate having an aperture formed in a scribing step thereof, and illustrating the substrate divided into element chips in the dicing step thereof, respectively.
Figure 2B:
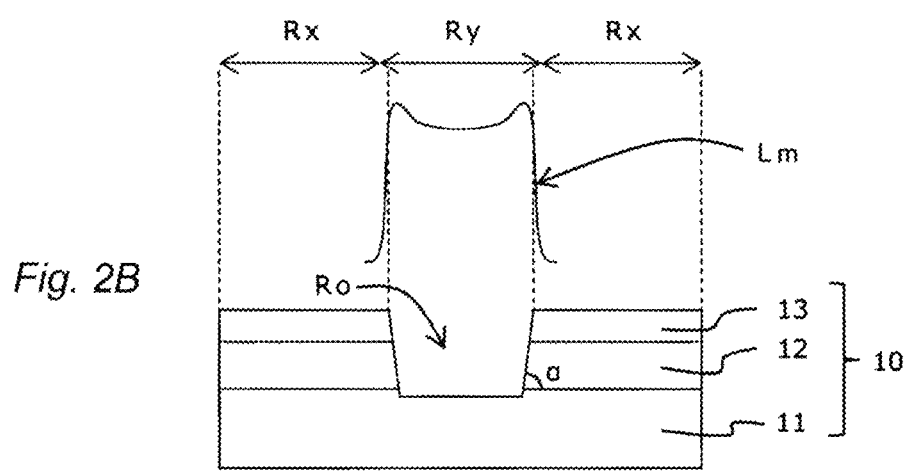
Figure 2C:
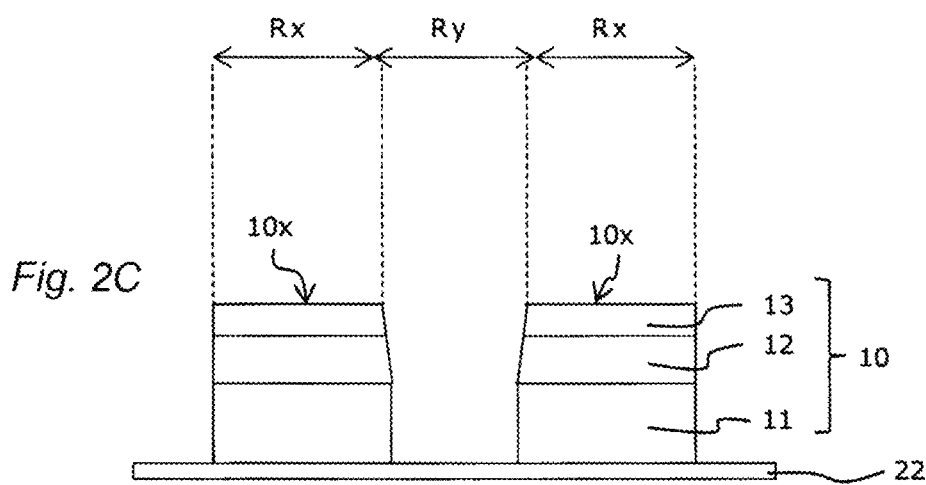
Figure 3A:
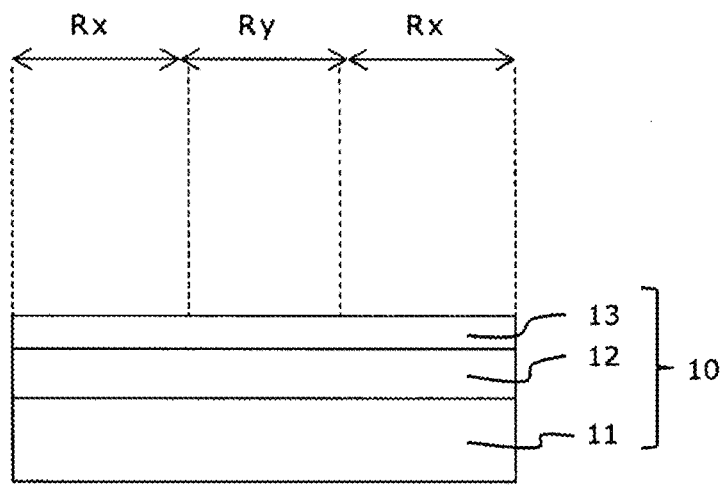
FIGS. 3A-3C are schematic cross-sectional views illustrating a preparation step of another manufacturing process of an element chip by radiating a laser beam having a Gaussian distribution in the width direction, illustrating the substrate having an aperture formed in a scribing step thereof, and illustrating the substrate divided into element chips in the dicing step thereof, respectively.
Figure 3B:
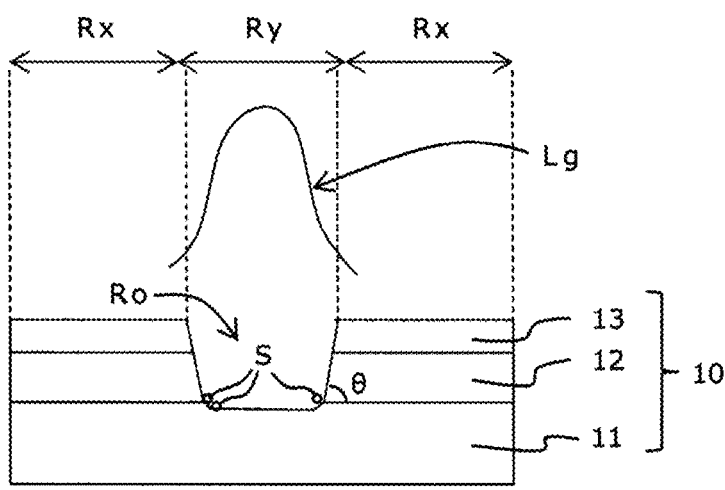
Figure 3C:
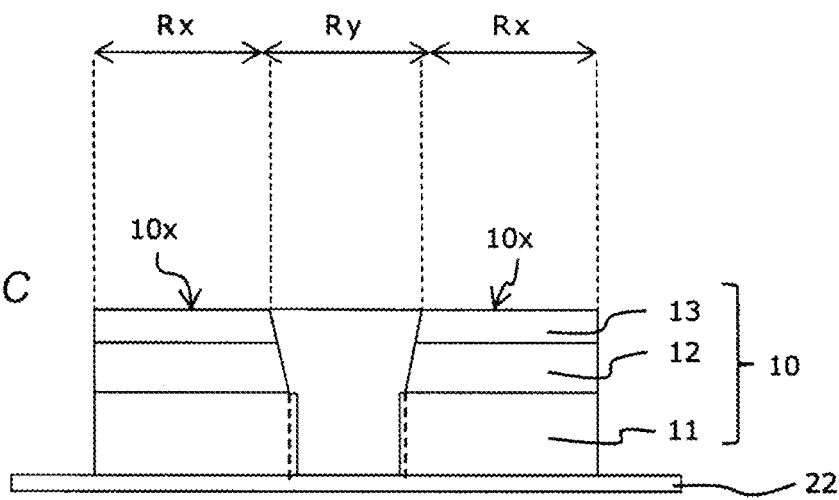

FIGS. 2A-2C illustrate steps for forming groove-like apertures through the wiring layer by radiating the laser beam having the width profile of the M-shaped distribution. Also, FIGS. 3A-3C illustrate steps for forming groove-like apertures by radiating the laser beam having the width profile of the Gaussian distribution. FIGS. 2A and 3A illustrate a preparation step of the substrate 10. FIGS. 2B and 3B illustrate the substrate 10 with the aperture Ro formed through the laser scribing step. FIGS. 2C and 3C illustrate the element chips 10x formed by plasma-etching the semiconductor layer 11 in the dicing region Ry. The plasma-dicing step may preferably be implemented with the substrate 10 being held on the supporting member 22 for ease of handling thereof.

The substrate 10 includes the semiconductor layer 11 having the first side 11A and the second side 11B, and also includes the circuit layer 12 formed on the first side 11A of the semiconductor layer 11, and the resin layer 13 for protecting the circuit layer 12. Further, the substrate 10 has a plurality of the element regions Rx and the dicing regions Ry defining each of the element regions Rx. In the present disclosure, the circuit layer 12 and the resin layer 13 are collectively referred to as the wiring layer.

As illustrated in FIG. 3B, when using the laser beam Lg having the Gaussian distribution in the scribing step, the laser beam has the peripheral portions with the energy density insufficient such that the taper angle $\theta$ of the side walls of the wiring layer to be formed along both sides of an apertures Ro may be reduced, and a portion of the resin layer 13 may be fluidified and agglomerated to form the resin balls S which in turn adhere to the peripheral edges on the bottoms of the apertures Ro. In the dicing step by the plasma exposure, the resin balls S may interfere the reaction between the semiconductor layer 11 and the plasma atmosphere, which likely forms an uneven or bumpy surface on the side walls of the element chips to be produced, causing a poor appearance and a low deflecting strength of the element chips 10x. FIG. 3C depicts a convex surface in a solid line and a convex surface in a dotted line defining the uneven or bumpy surface on the side walls of the semiconductor layer 11.

On the other hand, as illustrated in FIG. 2B, when using the laser beam having the M-shaped distribution with the good energy density at the peripheral portions in the scribing step, the taper angle $\alpha$ of the side walls of the wiring layer to be formed along both sides of an apertures Ro may be increased ($\theta<\alpha$) so that the verticality of side walls are improved. Also, the scribing step can be implemented without forming the resin balls S even in case that the wiring layer contains the resin layer 12 for protecting the resin layer 13.

The present invention is not limited to a spot shape of the laser beam. The spot shape thereof is referred to as a cross-sectional outline of the laser beam taken along a surface perpendicular to the optical axis thereof. The spot shape of the laser beam may be circular, oval, or polygonal.

Among others, the spot shape of the laser beam may preferably be oval, elliptical or similar thereto, of which outline has a minor diameter corresponding to the width of the dicing regions Ry. Although the minor diameter of the oval is preferably aligned in parallel to the width direction, the direction of the minor diameter of the oval and the width direction of the dicing regions may cross each other at a small angle (about 20° or less). The spot shape similar to the oval shape or the elliptical shape may be an egg-shape or a rectangular shape with round corners (elliptical), but not limited thereto.

Alternatively, the spot shape of the laser beam may preferably be a rectangular shape having a member extending along the width direction, or a shape similar thereto. Although the member extending along the width direction is preferably aligned in parallel to the width direction, they may cross each other at a small angle (about 20° or less). Also, while the rectangular spot shape preferably has another member angled to the width direction at 90°, it may have the other member angled to the width direction for example at 70-110°. The spot shape similar to the oval shape or the elliptical shape may be a rectangular shape with round corners (elliptical) or another rectangular shape with at least one member curved gradually, but not limited thereto.

Figure 4B:
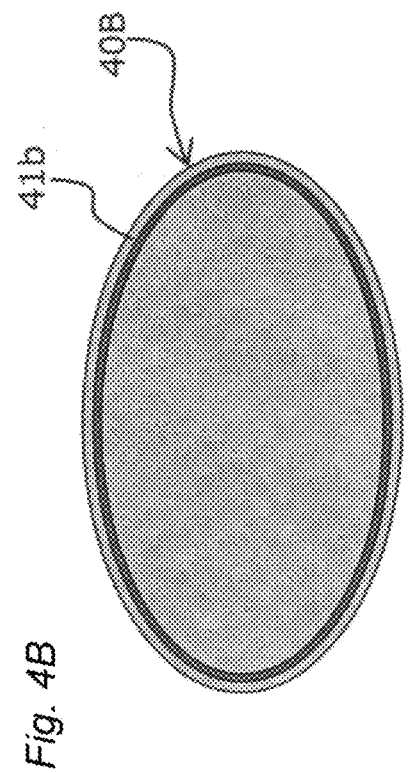
FIGS. 4A-4D are top plan views depicting a variety of spot shapes of the laser beam.
Figure 4D:
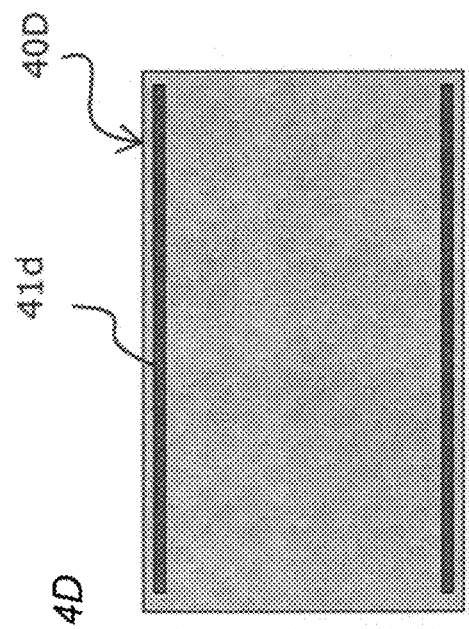
Figure 4A:
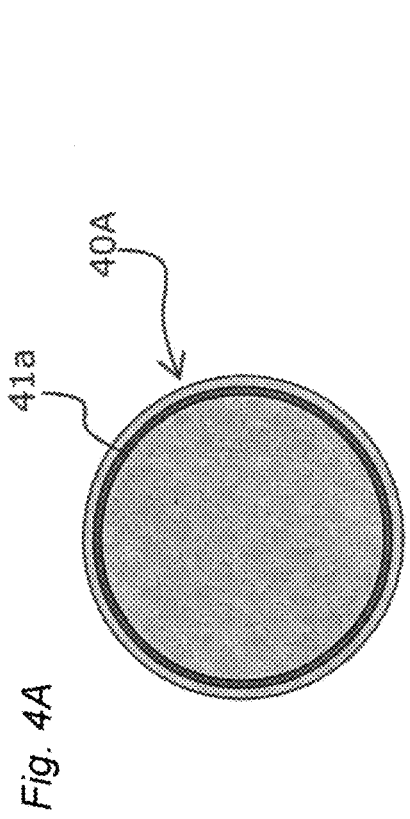
Figure 4C:
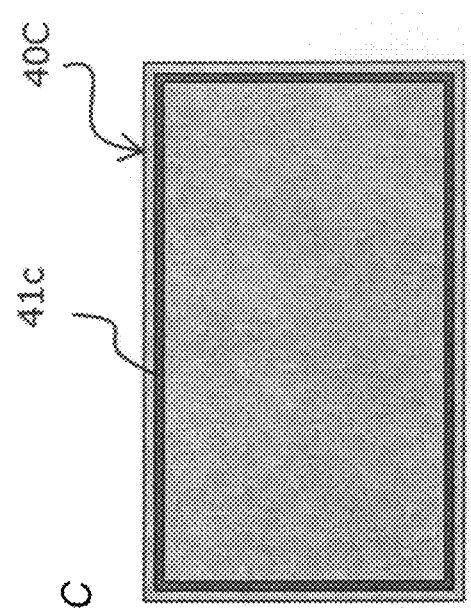

FIGS. 4A-4D exemplarily depict a variety of the spot shapes of the laser beam. For instance, FIG. 4A depicts the circular spot shape of the laser beam, FIG. 4B depicts the oval spot shape thereof, and FIGS. 4C and 4D depict the rectangular spot shape thereof. The peripheral portions of the spot shapes of the laser beam have regions 41a-41d (referred to as peak intensity regions) where the intensity of the laser beam profile have the maximal peaks as shown by bold solid lines.

The laser beam has a beam profile (referred to as a longitudinal profile) in a direction (referred to as a longitudinal direction) crossing the width direction of the dicing region Ry, which has the M-shaped distribution, similar to the width profile. However, it may have the longitudinal profile having the Gaussian distribution or the top hat distribution. For instance, FIGS. 4A-4C depict the longitudinal profile having the M-shaped distribution, and FIG. 4D depicts the longitudinal profile having the Gaussian distribution or the top hat distribution. The longitudinal direction is generally intended as to a direction along which the laser beam progresses, and crosses the width direction of dicing regions at 70-110° (preferably 90°).

The longitudinal profile having the M-shaped distribution may form an undulation on the bottoms of the grooves along the progressing or longitudinal direction of the pulsed laser beam. Also, as the laser beam has the peripheral portions along the width direction of the dicing regions Ry where an energy amount is less distributed, it is likely that the energy loss is relatively increased. On the other hand, when the longitudinal profile has the Gaussian distribution or the top hat distribution, the beam energy can effectively be used for ablating the wiring layer, which facilitates to reduce the undulation in the depth of the grooves.

Figure 5A:
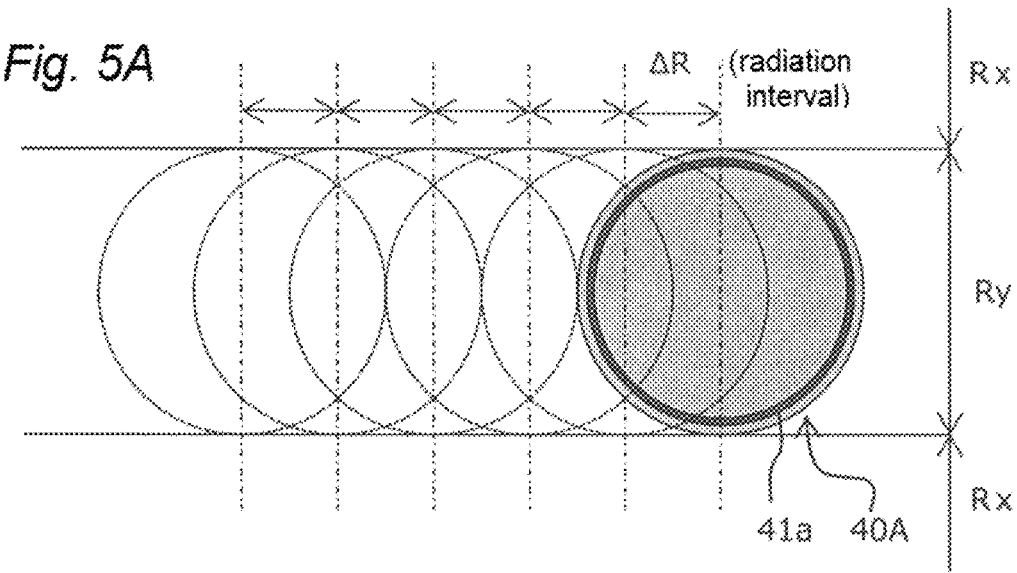
FIGS. 5A and 5B are top plan views illustrating how the scribing step is implemented along the dicing regions, by radiating the laser beam having a circular spot and an oval spot, respectively.
Figure 5B:
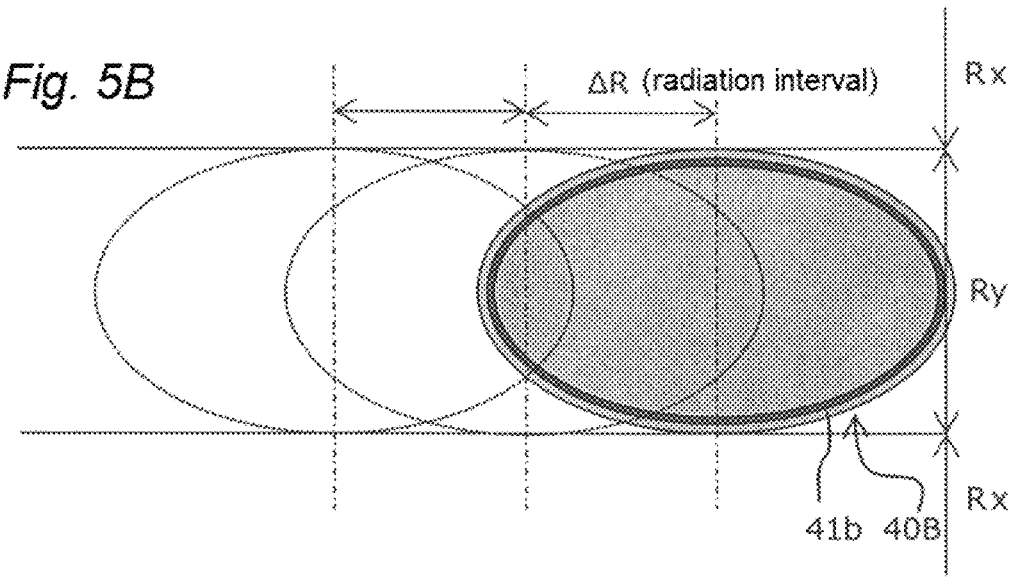

FIGS. 5A and 5B illustrate how the scribing step is implemented along the dicing regions Ry, by radiating the laser beam having the circular spot and the oval spot, respectively. As clearly understood when comparing FIG. 5A to FIG. 5B illustrating a radiation interval (ΔR) between adjacent spots of the pulsed laser beams, especially when adapting the laser beam having the circular spot, it is required to shorten the radiation interval (ΔR) for minimizing an asperity on the side walls to be formed along the element regions Rx. Thus, the laser beam having the oval spot with the minor diameter extending along the width direction of the dicing regions may preferably be adapted, rather than that having the circular spot, to enhance the processing speed thereby reducing the production time required for manufacturing the element chips 10x. Also, when adapting the laser beam having the M-shaped distribution along both of the width and longitudinal directions, the laser beam having the oval spot reduces a partial area to be scribed by the peak intensity regions 41b over the total area of the dicing regions Ry, in comparison with that 41a of the dicing regions Ry to be scribed by the laser beam having the circle spot. This reduces the energy loss to form the grooves and facilitates to reduce the undulation in the depth on the bottoms thereof.

Figure 6A:
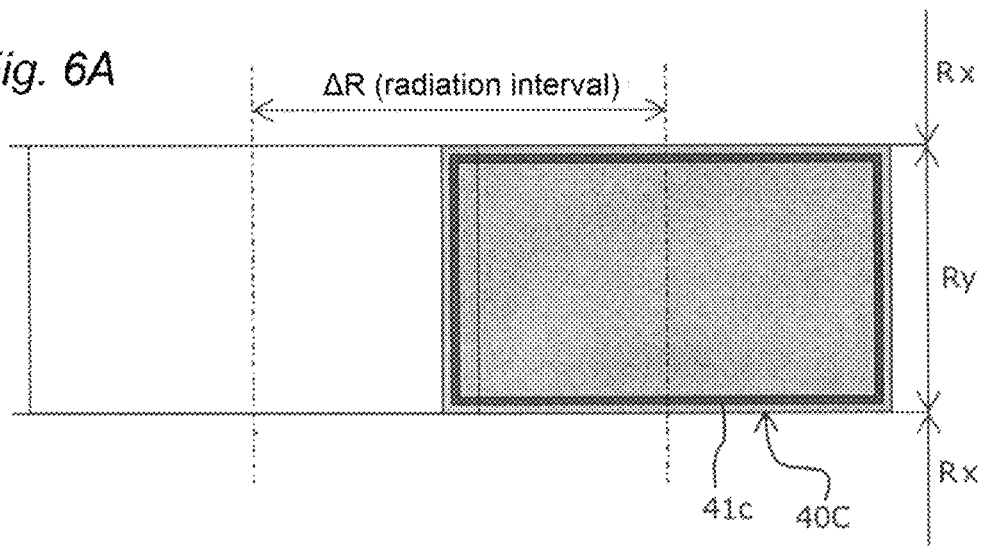
FIG. 6A is a top plan view illustrating how the scribing step is implemented along the dicing regions by radiating the laser beam with a rectangular spot having a M-shaped distribution in the width direction and in the longitudinal direction.

FIG. 6A illustrates how the scribing step is implemented along the dicing regions by radiating the laser beam with the rectangular spot. The beam spot of FIG. 6A has the M-shaped distribution both in the width and longitudinal directions. It is understood that the laser beam with the rectangular spot eliminates the asperity on the side walls along the element regions Rx. Also, the laser beam with the rectangular spot (preferably the rectangular spot longer in the progressing or longitudinal direction) can further increase the radiation interval (ΔR) of the adjacent beam spots, in comparison with the laser beam having the oval spot. While an overlapping rate or percentage is defined as the rate of the area of the beam spot overlapped by adjacent one, it is difficult for the laser beam having the oval spot to set the overlapping rate to be 75% or less. However, it is easy for laser beam having the rectangular spot to set the overlapping rate to be 50% or less, or even 20% or less.

Figure 6B:
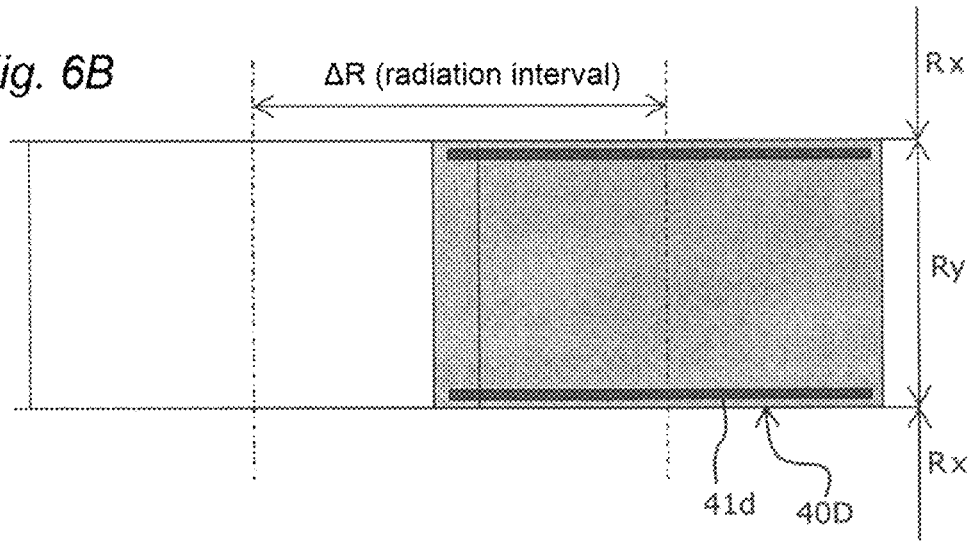
FIG. 6B is a top plan view illustrating how the scribing step is implemented along the dicing regions by radiating the laser beam with another rectangular spot having a M-shaped distribution in the width direction and a Gaussian or a top hat distribution in the longitudinal direction.

FIG. 6B illustrates how the scribing step is implemented along the dicing regions by radiating the laser beam with another rectangular spot profile having the M-shaped distribution in the width direction and the Gaussian distribution or the top hat distribution in the longitudinal direction. The partial area to be scribed by the peak intensity regions 41d of the beam spot of FIG. 6B are located mainly in the border between the dicing regions Ry and element regions Rx. Thus, the laser beam is shaped to have the peak intensity regions 41d restricted so that the energy loss is reduced and the undulation in the depth of the grooves are further inhibited.

In the scribing step, the laser beam may be radiated once or more times to form the grooves in the dicing regions on the substrate. The grooves may be formed by several subsequent radiations of the laser beam to reduce a thermal impact by the laser beam on peripheral portions around the dicing regions Ry. This substantially reduces or eliminates the thermal damages on the side walls of the wiring layer and the bottoms in the apertures. It should be noted that several subsequent radiations of the laser beam denote a plurality of scanning steps for radiating the laser beam onto the dicing regions Ry, rather than the number of the pulsed laser beams in one scanning step.

After the scribing step, a cleaning step may be implemented by a second plasma exposure. The second plasma exposure is generated under a condition different from the condition to generate the first plasma exposure for the dicing the step. The cleaning step is performed, for example, for further reducing the residues caused during the laser scribing step. This achieves the even higher quality of the plasma dicing step.

Next, referring to FIGS. 7 and 8, a system for scribing the substrate by radiating the laser beam will be described in detail hereinafter. The laser beam for laser-scribing the substrate may be shaped by the optical system as illustrated in FIG. 7. The optical system includes a laser oscillator 301, a zoom beam expander 302, a cylindrical lens 303 having a cross section of a semi-circular shape, a beam bender 304, a diffractive optical element (DOE) 305, and a collimating lens 306. The laser beam L is emitted from the laser oscillator 301, which has the Gaussian distribution in all directions, and is irradiated onto the zoom beam expander 302 performing a function of a collimator. The zoom beam expander 302 is configured to adjust a diameter of the laser beam L to a value appropriate for the DOE 305, to which the laser beam L enters through the cylindrical lens 303. The laser beam L having the circular laser spot is shaped to have the oval laser spot through the cylindrical lens 303 and irradiated onto the beam bender 304. The DOE 305 has a function to modify the profile of the laser beam having the M-shaped distribution in a predetermined direction. The shaped laser beam is then irradiated through the collimating lens 306 onto the object to be processed, i.e., the substrate 10 or the wiring layer thereof. The spot diameter of the laser beam is collimated by the collimating lens 306 to the substrate 10 (or the wiring layer thereof) to be processed, having the spot diameter in the width direction of the dicing regions, for example, of 35 µm or less (preferably 20 µm or less).

The DOE 305 can modify the spot shape of the laser beam to have any outlines. The DOE 305 may be configured to modify the spot shape having the Gaussian distribution to that of the top hat distribution when the irradiated laser beam L has the beam diameter A equal to a predetermined size D (A=D), to keep the spot shape having the Gaussian distribution when the irradiated laser beam L has the beam diameter A is less than the predetermined size D (A<D), and to modify the spot shape having the Gaussian distribution to that of the M-shaped distribution when the irradiated laser beam L has the beam diameter A is greater than the predetermined size D (A>D). When the beam modified through the cylindrical lens 303 to have the oval shape has the minor diameter less than the predetermined size D and the major diameter equal to or greater than the predetermined size D, the beam profile has the Gaussian distribution along the minor diameter and the Gaussian distribution or top hat distribution.

The laser beam through the collimating lens 306 of the apparatus of FIG. 7A has the beam profile, as schematically depicted in FIG. 7B, having the M-shaped distribution in the width direction as shown in FIG. 1 and having the Gaussian distribution in the longitudinal direction as shown in FIG. 3B. In this instance, the beam profile of the beam spot presents the energy distribution as depicted in FIG. 7B.

Figures 8A, 8B:
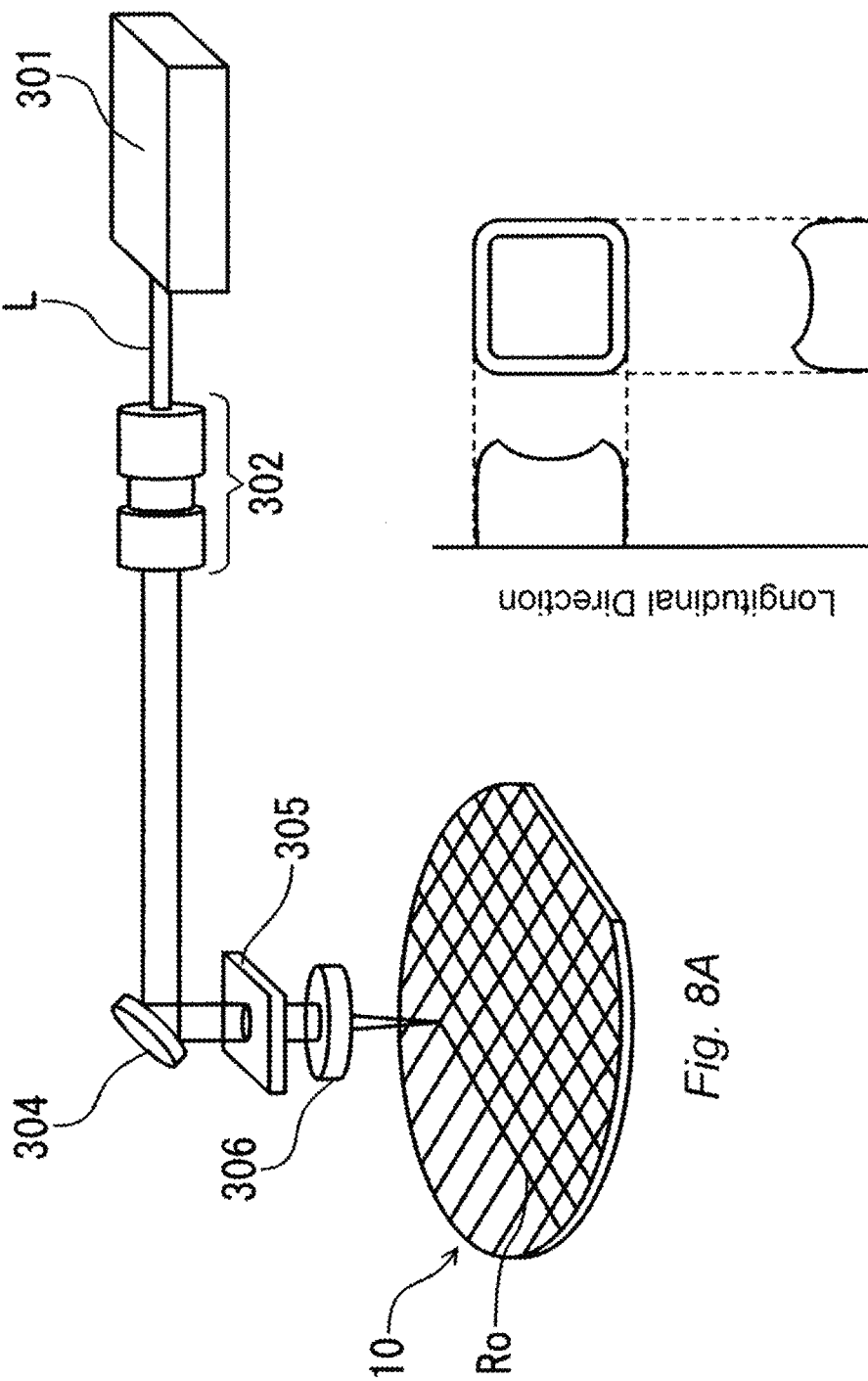
FIG. 8A is a conceptual view depicting another exemplary apparatus for radiating the laser beam onto the substrate.
FIG. 8B is a schematic view illustrating spot cross-sectional shapes of another laser beam.

The optical system of FIG. 8 has a structure similar to that of FIG. 7 except that the cylindrical lens 303 is eliminated. In the optical system of FIG. 8, the beam spot of the laser beam L to be irradiated onto the DOE remains circular, and when the diameter is less than the predetermined size D, the laser beam having the beam profile having the M-shaped distribution along all directions. In this instance, the beam profile of the beam spot shaped by the DOE presents the M-shaped energy distribution, both in the width and longitudinal directions as depicted in FIG. 8B.

The laser oscillator 301 may preferably be a pulsed-laser oscillator oscillating the pulsed laser beam. The mechanism for oscillating the pulsed-wave laser beam is not limited to a particular one, and the pulsed-wave laser oscillator 301 may be adapted in any forms, which, for example, mechanically shutters the laser beam ON and OFF, controls an optical source of the laser beam L to be excited intermittently, or optically switches laser beam L output therefrom. The type of the laser oscillator 301 is not limited to a particular one, and may be, for example, a semiconductor laser oscillator using a semiconductor material as a laser media for a laser oscillation, a gas laser oscillator using a gas such as carbon dioxide ($CO_2$) as the laser media, a solid laser oscillator using a solid material such as yttrium aluminum garnet (YAG) as the laser media, and a fiber laser oscillator. The solid laser oscillator may emit green laser beam or ultra-violet laser beam obtained by a wavelength conversion.

Although not limited thereto, a pulse width of the laser beam L irradiated onto the substrate 10 may preferably be 500 ns or less, more preferably 200 ns or less, to reduce the thermal impact thereto. Also, although not limited thereto, a peak wavelength of the laser beam L may preferably be in an ultra-violet region (having the peak wavelength between about 200 nm and about 400 nm) or a visible region having a relatively short wavelength (having the peak wavelength between about 400 nm and about 550 nm), to enhance an absorption of the laser beam L to the substrate. Furthermore, although not limited thereto, a frequency of the laser beam L may be between about 1 kHz and 200 kHz, and higher frequency of the laser beam L allows a higher rate processing.

Figure 9:
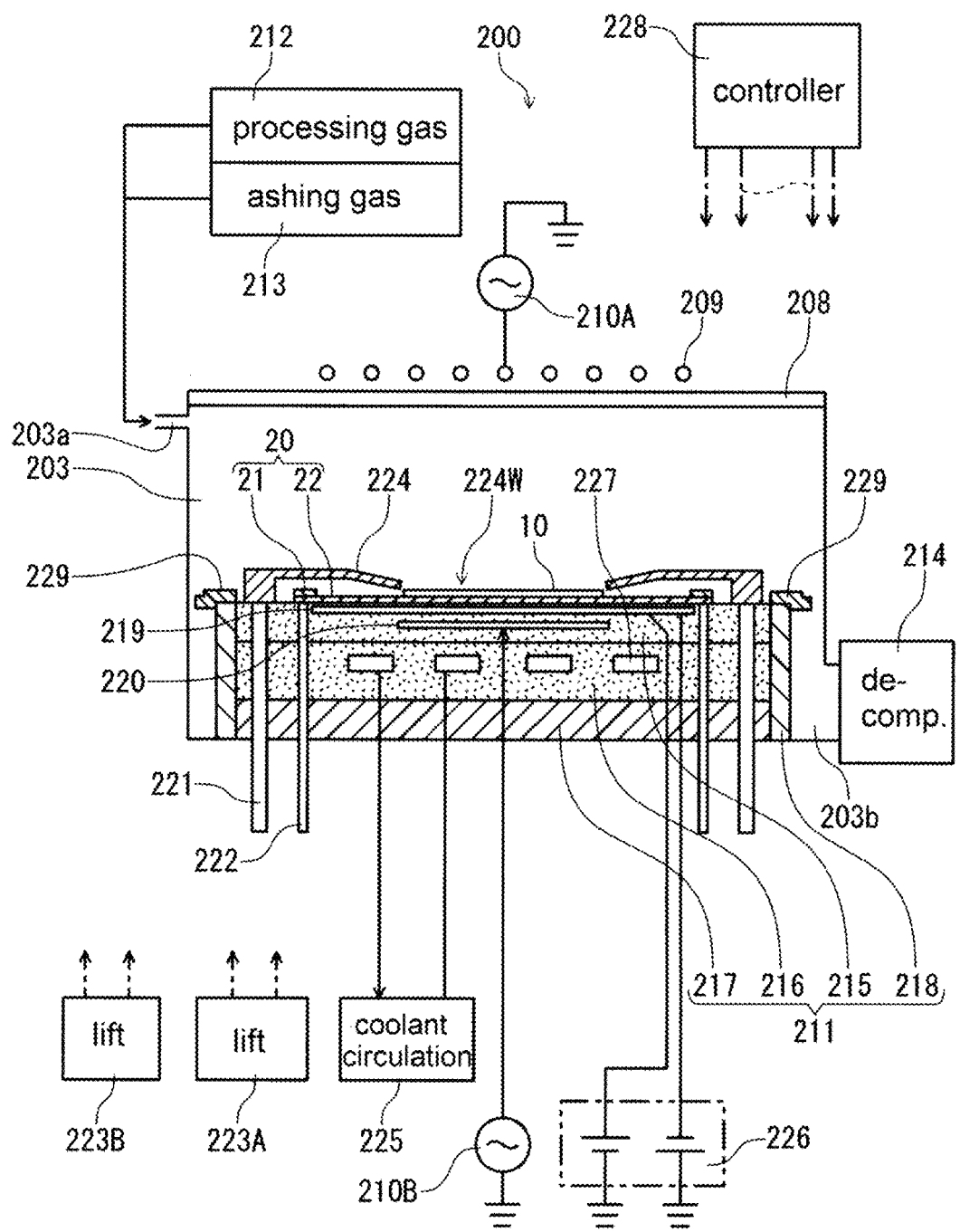
FIG. 9 is a conceptual view depicting a schematic structure in a cross section of a plasma processing apparatus.
Figure 10A:
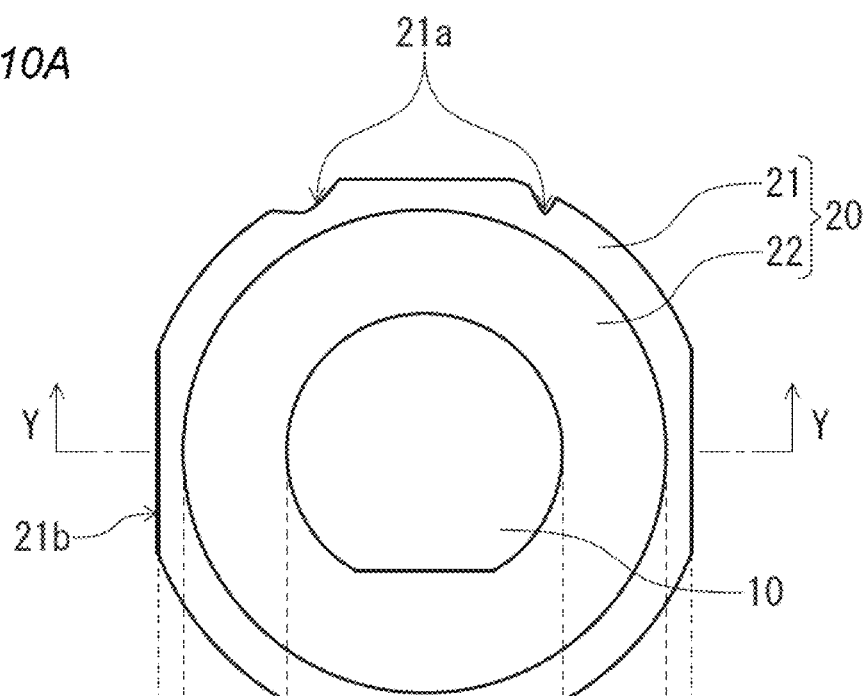
FIG. 10A is a top plan view depicting a conveying carrier supporting the substrate.
Figure 10B:
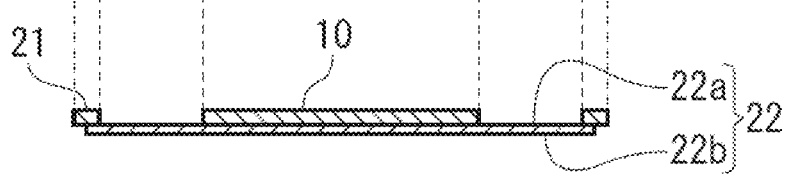
FIG. 10B is a cross-sectional view taken along a line Y-Y of FIG. 10A.

Next, referring to FIG. 9, a plasma processing apparatus 200 will be described herein, although it is not limited to one described herein. In the plasma dicing step, the substrate 10 may preferably be held on the supporting member 22 as illustrated in FIGS. 10A and 10B, to facilitate a manipulation of the substrate 10. The second side 11B of the semiconductor layer 11 of the substrate 10 is adhered on the supporting member 22. The material of the supporting member 22 is not limited to a particular one. Since the substrate 10 being held on the supporting member 22 is diced into the element chips 30, the supporting member 22 may preferably be made from a flexible resin film for ease of picking up each of the divided element chips 30 in a subsequent die-bonding step (not described in detail). A frame 21 is held on the supporting member 22 also for easy manipulation. In the present disclosure, the supporting member 22 and the frame 21 held thereon will collectively be referred to as a conveying carrier 20. FIG. 10A is a top plan view of the conveying carrier 20 and the substrate held on the supporting member 22, and FIG. 10B is a cross-sectional view taken along a line Y-Y of FIG. 10A. The supporting member 22 includes an adhesive side 22a having an adhesive thereon and a non-adhesive side 22b having no adhesive thereon. The frame 21 may be provided with a notch 21a and a corner cut 21b for alignment thereof.

The plasma processing apparatus 200 includes a vacuum chamber 203 and a stage 211 within a processing space therein. The vacuum chamber 203 is provided with a gas inlet 203a for introducing a gas and a gas outlet 203b for exhausting a gas. The inlet 203a is configured to be connected selectively to one of a processing gas source 212 and an ashing gas source 213. The outlet 203b is connected to a decompressing mechanism 214 having a vacuum pump for exhausting a gas within the vacuum chamber 203 and decompressing it.

The substrate 10 held on the conveying carrier 20 is set on the stage 211. Provided around the peripheral portion of the stage 211 is a plurality of supporting rods 222 driven by a lifting mechanism 223A to move upward and downward. The conveying carrier 20 is delivered into the vacuum chamber 203, set on the supporting rods 222 at a raised level, and lowered onto the stage 211.

Arranged over the stage 211 is a cover 224 which covers at least a portion of the frame 21 of the conveying carrier 20 and the supporting member 22, and includes a window 224W exposing at least a portion of the substrate 10. The cover 224 is connected to a plurality of lifting rods 221 and driven by another lifting mechanism 223B. The vacuum chamber 203 has an opening at the top thereof, which is closed by a dielectric member 208. An antenna 209 is provided above the dielectric member 208 as an upper electrode, and electrically connected to a first high-frequency power source 210A.

The stage 211 includes an electrode layer 215, a metal layer 216, and a base member 217 positioned sequentially from the top thereof, which are surrounded by a peripheral member 218. Provided on an upper surface of the peripheral member 218 is an annular circumferential ring 229 for protecting it from the plasma exposure. Arranged within the electrode layer 215 are an electrode 219 (referred to as an electrostatic chuck (ESC) electrode) composing an electrostatic chucking mechanism and a high-frequency electrode 220 that is connected to a second high-frequency power source 210B. The ESC electrode 219 is electrically connected to a DC power source 226. The plasma etching step can be implemented by supplying the high-frequency electrode 220 with the high-frequency power with the bias voltage applied. The metal layer 216 contains a coolant channel 227 configured to cool the stage 211, and a coolant in the coolant channel 227 is circulated by a coolant circulation apparatus 225.

The controller 228 controls operations of the plasma processing apparatus 200 including the first high-frequency power source 210A, the second high-frequency power source 210B, the processing gas source 212, the ashing gas source 213, the decompressing mechanism 214, the coolant circulation apparatus 225, the lifting mechanisms 223A, 223B, and the electrostatic chucking mechanism.

The plasma atmosphere is generated under an etching condition such that the semiconductor layer 11 of the substrate 10 is etched. The etching condition may be determined appropriately in accordance with a material of the semiconductor layer 11. When the semiconductor layer 11 is made of silicon, so-called a bosch process can be used to etch the semiconductor layer 11 along each of the dicing regions Ry. In the bosch process, a series of steps including a step for depositing a protective layer, a step for etching the deposited or protective layer, and a step for etching the silicon substrate are repeatedly performed to deeply dig each of the grooves in a thickness direction.

In the step for depositing the protective layer, for example, while the vacuum chamber 203 may be supplied with the source gas of $C_4H_8$ at a rate of 150-250 sccm to have the pressure controlled between 15-25 Pa, the antenna 209 may be applied with power of 1500-2500 W from the first high-frequency source 210A, and the high-frequency electrode 220 may be applied with power of 0 W from the second high-frequency source 210B, for the processing time of 5-15 seconds.

In the step for etching the protective layer, for example, while the vacuum chamber 203 may be supplied with the source gas of $SF_6$ at a rate of 200-400 sccm to have the pressure controlled between 5-15 Pa, the antenna 109 may be applied with power of 1500-2500 W from the first high-frequency source 210A, and the high-frequency electrode 120 may be applied with power of 100-300 W from the second high-frequency source 210B, for the processing time of 2-10 seconds.

In the step for etching the silicon substrate, for example, while the vacuum chamber 203 may be supplied with the source gas of $SF_6$ at a rate of 200-400 sccm to have the pressure controlled between 5-15 Pa, the antenna 209 may be applied with power of 1500-2500 W from the first high-frequency source 210A, and the high-frequency electrode 220 may be applied with power of 50-200 W from the second high-frequency source 210B, for the processing time of 10-20 seconds.

Under the aforementioned conditions, the step for depositing the protective layer, the step for etching the deposited or protective layer, and the step for etching the silicon substrate may be repeatedly performed so as to deeply dig the semiconductor layer 11 of the substrate 10 along each of the dicing regions Ry in a thickness direction at a rate of 10 µm per minute. When generating the plasma atmosphere in the vacuum chamber 203, several types of the source gases may be used. In this instance, several types of the source gases may be introduced into the vacuum chamber 203 with a time lag therebetween, or may be mixed and then introduced into the vacuum chamber 203.

As described above, while the substrate 10 is held on the supporting member 22, it is divided into a plurality of element chips 10x each having the element region Rx. After the plasma dicing step, the plurality of the element chips 10x being held on the supporting member 22 are delivered to a pick-up step. In the pick-up step, each of the plurality of the element chips 10x is peeled off the supporting member 22.

After the plasma dicing process, the protective or resin layer remaining on the element chips 10x may be removed by the ashing or cleaning step.

Second Embodiment

A manufacturing process of an element chip according to a second embodiment of the present invention comprises a preparation step for preparing a substrate which includes a semiconductor layer having first and second sides, and a wiring layer formed on the first side of the semiconductor layer. The substrate includes a plurality of element regions and a plurality of dicing regions (streets) defining each of the element regions. The wiring layer may include a circuit layer and a resin layer for protecting a surface of the circuit layer. The circuit layer may contain a metal material and the resin layer may contain a resin material. The dicing regions are defined on the first side of the substrate in a predetermined linear pattern.

The semiconductor layer may be formed of silicon (Si), gallium arsenide (GaAs), gallium nitride (GaN), or silicon carbide (SiC), for example.

The wiring layer typically includes the circuit layer and the resin layer for protecting the surface of the circuit layer. The circuit layer may contain, for example, a low-k (low-dielectric) material, a copper (Cu) wiring layer, a metal material, an insulating layer such as a silicon dioxide ($SiO_2$) layer or a silicon nitride ($Si_3N_4$) layer, lithium tantalate ($LiTaO_3$), and lithium niobate ($LiNbO_3$). The resin layer may contain a thermosetting resin such as polyimide, a photoresist such as a phenol resin, and a water-soluble resist such as an acrylic resin.

The manufacturing process of the element chip comprises a scribing step for forming apertures (gaps) exposing the semiconductor layer along the dicing regions by radiating a first laser beam towards the first side onto the dicing regions of the wiring layer once or more times, and then radiating a second laser beam onto the dicing regions thereof. Typically, the apertures are formed along the linear dicing regions in a configuration of grooves. The narrower apertures of the grooves are more desirable for a better productivity of the element chips from the substrate. As a verticality of the side walls of the wiring layers along both sides of the apertures is better improved, the narrower apertures of the grooves can more easily be formed.

In the scribing step, the first laser beam is radiated mainly onto the resin layer. The first laser beam has a beam profile having a M-shaped distribution whose peripheral intensity is greater than a central intensity at least in a width direction along the dicing regions of the laser beam. In the present application, the beam profile in the width direction along the dicing region is referred to as a "width profile". Thus, the width profile depicts a beam intensity distribution in a cross section of the laser beam taken along the width direction of the dicing region. Also, the width direction of the dicing region corresponds to the width direction of the groove-like apertures (gaps), which is perpendicular to a longitudinal direction of the streets.

When scribing the dicing regions with the laser beam having the Gaussian distribution or the top hat distribution as typical, the energy density at peripheral portions of the laser beam is insufficient to fully ablate the resin layer, causing the resin fluidified and agglomerated due to a surface tension, which are likely adhered as resin balls to the peripheral edges on the bottoms of the apertures. In this scenario, when the circuit layer is laser-scribed, the semiconductor layer is damaged at portions on the bottom surfaces with the resin balls re-solidified and trapped in the damaged portions. The re-solidified resin balls may perform as masks during the plasma exposure, causing the semiconductor layer plasma-etched in a non-uniform manner. On the other hand, according to the present embodiment, the resin layer is scribed by radiating the first laser beam having the M-shaped distribution with a good energy density at the peripheral portion thereof, so that the peripheral edges of the bottom apertures receive the sufficient beam energy. This allow the resin layer ablated at the peripheral edges of the apertures, thereby to inhibit the resin balls. It should be noted that the resin balls cause no problem when the semiconductor layer is diced mechanically by, for example, a blade cutter.

Also, the resin layer is scribed by radiating the first laser beam having the M-shaped distribution, so that the verticality of the side walls along both sides of the apertures is improved. When the side walls of the wiring layer along both sides of the apertures are formed to have a less sufficient verticality, the plasma etching step to the semiconductor layer may disorganize or disorder the side walls of the element chips to be formed, and may likely reduce a deflecting strength thereof. However, the quality of the apertures may be enhanced by improving the verticality of the side walls of the wiring layer so that the side walls of the semiconductor layer to be etched are well organized, thereby produce high-quality element chips of a high deflecting strength. Furthermore, the higher verticality of the side walls of the wiring layer allows the narrower (or smaller) groove-like apertures, thereby reducing a useless margin (dead space) of the substrate.

FIG. 1 is a conceptual view depicting the width profile having the M-shaped distribution of the first laser beam. The horizontal axis depicts a position of the dicing region in the width direction, and the vertical axis depicts an optical intensity (energy density) of the first laser beam. The central intensity of the width profile is shown as the intensity Ec at the central position in the dicing region. The peripheral intensity of the width profile is shown as the intensity Et of a pair of maximal peaks P1 and P2 positioned at both ends of the width profile with the central position therebetween.

The central intensity Ec of the first laser beam may preferably be greater than a first threshold intensity required to laser-ablate the resin layer and less than a second threshold intensity required to laser-ablate the circuit layer. In this instance, the peripheral intensity Et is designed to be greater than the first threshold intensity. Therefore, the resin layer in width across the dicing regions can easily be ablated so that the resin balls are further inhibited. Also, the peripheral intensity Et is designed to be less than the second threshold intensity. This prevents the circuit layer beneath the resin layer from being scribed. When the resin layer is scribed together with the circuit layer, the re-solidified resin balls may easily be trapped in the damaged portions on the surface of the semiconductor layer.

The laser beam having the M-shaped distribution in the width profile may be configured by shaping the laser beam having a Gaussian distribution in the width profile as described in the first embodiment. The peripheral intensity of the M-shaped distribution is greater than that of the Gaussian distribution. This improves the verticality of the side walls of the wiring layer at both sides of the apertures. Also, the central intensity of the M-shaped distribution may be reduced to one-half of, or even one-thirds or less of the central intensity of the central intensity of the Gaussian distribution before being shaped. This facilitates to prevent the circuit layer from being scribed by the first laser beam.

The laser beam having the M-shaped distribution in the width profile may have substantially the same intensity at two of the maximal peaks P1 and P2 on both sides thereof, as shown in FIG. 1. When there is a difference between the intensity at the maximal peaks P1 and P2, the difference therebetween is preferably 10% of an average of the intensity thereof. Also, the peripheral intensity Et is preferably 105% or more, and more preferably 110% or more than the central intensity Ec, thereby to emphasize the advantage due to the laser beam having the M-shaped distribution in the width profile.

In the meanwhile, the second laser beam is radiated onto the circuit layer. The second laser beam has a beam profile having the Gaussian distribution or the top hat distribution. The Gaussian distribution is used to mean a so-called normal distribution. The top hat distribution has a beam profile having substantially the same intensity in width across the dicing regions, and having the peripheral intensity at the peripheral portions (e.g., shoulder portions where the intensity is rapidly decreasing) which is almost the same as the central intensity, and for example, between 90-98% of the central intensity. The central intensity of the second laser beam as mentioned above can easily be increased as desired, so that the intensified laser beam may be used for laser-scribing the circuit layer (which requires substantial intensity of the laser beam) in an efficient manner. The central intensity of the second laser beam may preferably be greater than the second threshold intensity required to laser-ablate the circuit layer.

Figure 11A:
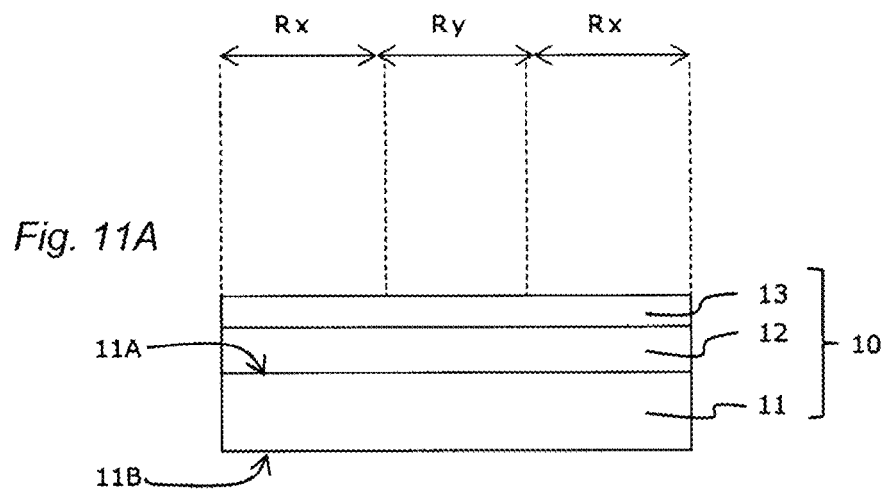
FIGS. 11A-11D are schematic cross-sectional views illustrating a preparation step of another manufacturing process of the element chip, by radiating a laser beam having a M-shaped distribution in the width direction, illustrating the substrate having an aperture formed by a first laser beam, illustrating the substrate having an aperture formed by a second laser beam, and illustrating the substrate divided into element chips in the dicing step thereof, respectively.
Figure 11B:
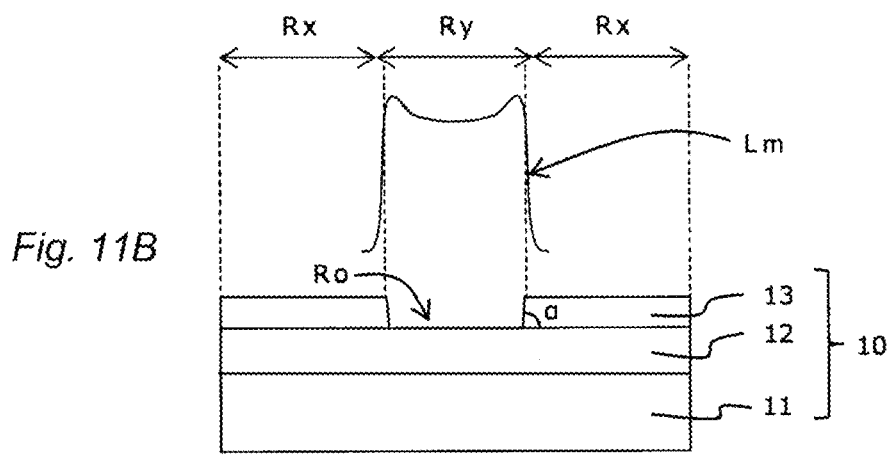
Figure 11C:
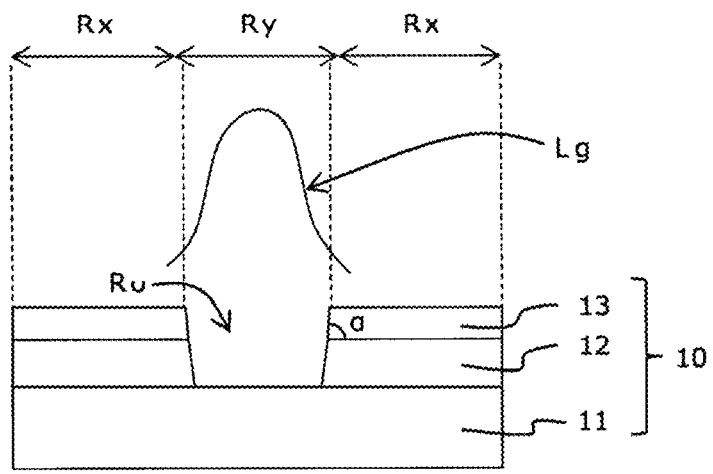
Figure 11D:
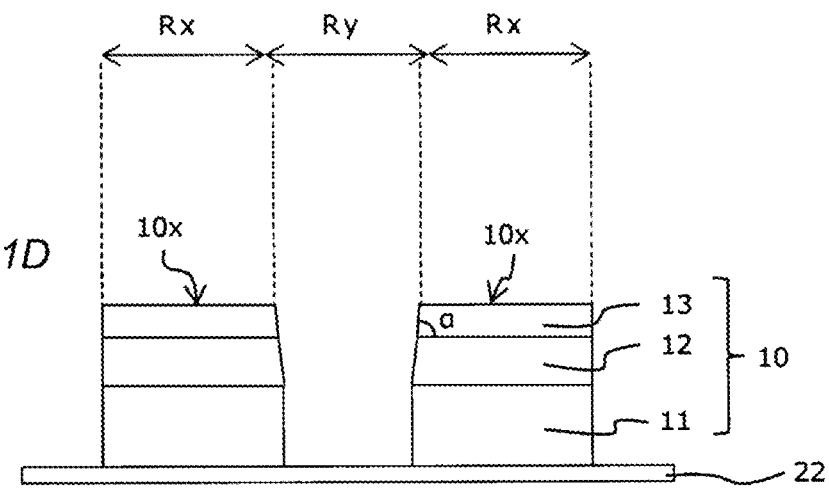

FIGS. 11A-11D illustrate steps for forming groove-like apertures through the wiring layer by radiating the laser beam having the width profile of the M-shaped distribution. Also, FIGS. 3A-3C illustrate steps for forming groove-like apertures by radiating the laser beam having the width profile of the Gaussian distribution. FIGS. 11A and 3A illustrate a preparation step of the substrate 10. FIG. 11B illustrates the substrate 10 with the aperture Ro formed in the resin layer 13 through the first laser scribing step. FIG. 11C illustrates the substrate 10 with the aperture Ro formed in the circuit layer 12 through the second laser scribing step. FIG. 3B illustrates the substrate 10 with the aperture Ro formed in the wiring layer through the laser scribing steps. FIGS. 11D and 3C illustrate the element chips 10x formed by plasma-etching the semiconductor layer 11 in the dicing region Ry. The plasma-dicing step may preferably be implemented with the substrate 10 being held on the supporting member 22 for ease of handling thereof.

The substrate 10 includes the semiconductor layer 11 having the first side 11A and the second side 11B, and also includes the circuit layer 12 formed on the first side 11A of the semiconductor layer 11, and the resin layer 13 for protecting the circuit layer 12. Further, the substrate 10 has a plurality of the element regions Rx and the dicing regions Ry defining each of the element regions Rx.

As illustrated in FIG. 3B, when using the laser beam Lg having the Gaussian distribution in the scribing step, the laser beam has the energy density at the peripheral portions insufficient such that the taper angle θ of the side walls of the wiring layer to be formed along both sides of the apertures Ro may be reduced, and a portion of the resin layer 13 may be fluidified and agglomerated to form the resin balls S which in turn adhere to the peripheral edges on the bottoms of the apertures Ro. In the dicing step by the plasma exposure, the resin balls S may interfere the reaction between the semiconductor layer 11 and a plasma atmosphere, which likely forms an uneven or bumpy surface on the side walls of the element chips to be produced, causing a poor appearance and a low deflecting strength of the element chips 10x. FIG. 3C depicts a convex surface in a solid line and a convex surface in a dotted line defining the uneven or bumpy surface on the side walls of the semiconductor layer 11.

On the other hand, as illustrated in FIG. 11B, when using the laser beam having the M-shaped distribution with the good energy density at the peripheral portions in the scribing step, the taper angle α of the side walls of the resin layer 13 to be formed along both sides of an apertures Ro may be increased (θ<α) so that the verticality of side walls to be formed along the apertures Ro are improved. The higher verticality of the side walls of the resin layer 13 allows the narrower (or smaller) groove-like apertures of the side walls of the circuit layer 12 to be formed by subsequently radiating the second laser beam even having the Gaussian or the top hat distribution, as illustrated in FIG. 11C. Also, the scribing step by the first laser beam and the second laser beam can be implemented without forming the resin balls S.

The present invention is not limited to a spot shape of the first laser beam and the second laser beam. The spot shape thereof is referred to as a cross-sectional outline of the laser beam taken along a surface perpendicular to the optical axis thereof. The spot shape of the laser beam may be circular, oval, or polygonal. The spot shape of the first laser beam may be the same as or different from that of the second laser beam. For example, the resin layer 13 may be scribed by radiating the first laser beam having a rectangular spot shape, and then the circuit layer 12 may be scribed by radiating the second laser beam having a circular spot shape.

Among others, the spot shape of the first laser beam may preferably be oval, elliptical or similar thereto, of which outline has a minor diameter corresponding to the width of the dicing regions Ry. While the minor diameter of the oval may be preferably aligned in parallel to the width direction, the direction of the minor diameter of the oval and the width direction of the dicing regions may cross each other at a small angle (about 20° or less). The spot shape similar to the oval shape or the elliptical shape may be an egg-shape or a rectangular shape with round corners (elliptical), but not limited thereto.

Alternatively, the spot shape of the first laser beam may preferably be a rectangular shape having a member extending along the width direction, or similar thereto. While the member extending along the width direction is preferably aligned in parallel to the width direction, they may cross each other at a small angle (about 20° or less). Also, while the rectangular spot shape preferably has another member angled to the width direction at 90°, it may have the other member angled to the width direction for example at 70-110°. The spot shape similar to the oval shape or the elliptical shape may be a rectangular shape with round corners (elliptical) or another rectangular shape with at least one member curved gradually, but not limited thereto.

FIGS. 4A-4D exemplarily depict a variety of the spot shapes of the laser beam. For instance, FIG. 4A depicts the circular spot shape of the laser beam, FIG. 4B depicts the oval spot shape thereof, and FIGS. 4C and 4D depict the rectangular spot shape thereof. The peripheral portions of the spot shapes of the laser beam have regions 41a-41d (referred to as peak intensity regions) where the intensity of the laser beam profile have the maximal peaks as shown by bold solid lines.

The first laser beam has a beam profile (referred to as a longitudinal profile) in a direction (referred to as a longitudinal direction) crossing the width direction of the dicing region Ry, which has the M-shaped distribution, similar to the width profile. However, it may have the longitudinal profile having the Gaussian distribution or the top hat distribution. For instance, FIGS. 4A-4C depict the longitudinal profile having the M-shaped distribution, and FIG. 4D depicts the longitudinal profile having the Gaussian distribution or the top hat distribution. The longitudinal direction is generally intended as to a direction along which the laser beam progresses, and crosses the width direction of dicing regions at 70-110° (preferably 90°).

The longitudinal profile of the first laser beam having the M-shaped distribution may form an undulation on the bottoms of the grooves along the progressing direction of the pulsed laser beam. Also, as the laser beam has the peripheral portions along the width direction of the dicing regions Ry where an energy amount is less distributed, it is likely that the energy loss is relatively increased. On the other hand, when the longitudinal profile of the first laser beam has the Gaussian distribution or the top hat distribution, the beam energy can effectively be used for ablating the wiring layer, which facilitates to reduce the undulation in the depth of the grooves.

FIGS. 5A and 5B illustrate how the scribing step is implemented along the dicing regions Ry, by radiating the laser beam having the circular spot and the oval spot, respectively. As clearly understood when comparing FIG. 5A to FIG. 5B illustrating a radiation interval (ΔR) between adjacent spots of the pulsed laser beams, especially when adapting the laser beam having the circular spot, it is required to shorten the radiation interval (ΔR) for minimizing an asperity on the side walls to be formed along the element regions Rx. Thus, the laser beam having the oval spot with the minor diameter extending along the width direction of the dicing regions may preferably be adapted, rather than that having the circular spot, to enhance the processing speed thereby reducing the production time required for manufacturing the element chips 10x. Also, when adapting the laser beam having the M-shaped distribution along both of the width and longitudinal directions, the laser beam having the oval spot reduces a partial area to be scribed by the peak intensity regions 41b over the total area of the dicing regions Ry, in comparison with that 41a of the dicing regions Ry to be scribed by the laser beam having the circle spot. This reduces the energy loss to form the grooves and facilitates to reduce the undulation in the depth on the bottoms thereof.

FIG. 6A illustrates how the scribing step is implemented along the dicing regions by radiating the laser beam with the rectangular spot. The beam spot of FIG. 6A has the M-shaped distribution both in the width and longitudinal directions. It is understood that the laser beam with the rectangular spot eliminates the asperity on the side walls along the element regions Rx. Also, the laser beam with the rectangular spot (preferably the rectangular spot longer in the progressing or longitudinal direction) can further increase the radiation interval (ΔR) of the adjacent beam spots, in comparison with the laser beam having the oval spot. While an overlapping rate or percentage is defined as the rate of the area of the beam spot overlapped by adjacent one, it is difficult for the laser beam having the oval spot to set the overlapping rate to be 75% or less. However, it is easy for laser beam having the rectangular spot to set the overlapping rate to be 50% or less, or even 20% or less.

FIG. 6B illustrates how the scribing step is implemented along the dicing regions by radiating the laser beam with another rectangular spot profile having the M-shaped distribution in the width direction and the Gaussian distribution or the top hat distribution in the longitudinal direction. The partial area to be scribed by the peak intensity regions 41d of the beam spot of FIG. 6B are located mainly in the border between the dicing regions Ry and element regions Rx. Thus, the laser beam is shaped to have the peak intensity regions 41d restricted so that the energy loss is reduced and the undulation in the depth of the grooves are further inhibited.

In the scribing step, the first laser beam and the second laser beam may be radiated once or more times to form the grooves in the dicing regions on the substrate. The grooves may be formed by several subsequent radiations of the laser beam to reduce a thermal impact by the laser beam on peripheral portions around the dicing regions Ry. This substantially reduces or eliminates the thermal damages on the side walls of the wiring layer and the bottoms in the apertures Ro. It should be noted that several subsequent radiations of the laser beam denote a plurality of scanning steps for radiating the laser beam onto the dicing regions Ry, rather than the number of the pulsed laser beams in one scanning step.

After the scribing step, the dicing step may be made by a plasma exposure (a first plasma exposure) onto the substrate 10. While the element regions Rx of the semiconductor layer 11 are masked by the wiring layer 13, the dicing regions Ry of the semiconductor layer 11 uncovered by the apertures are etched by the plasma exposure. This allows the substrate 10 to be divided into a plurality of element chips 10x each having an element region Rx.

After the scribing step, a cleaning step may be implemented by a second plasma exposure. The second plasma exposure is generated under a condition different from the condition to generate the first plasma exposure for the dicing the step. The cleaning step is performed, for example, for further reducing the residues caused during the laser scribing step. This achieves the even higher quality of the plasma dicing step. Also, the cleaning step is implemented by radiating the laser beam (e.g., the first laser beam) having the beam profile having the M-shaped distribution in the width direction.

The system used for laser-scribing the wiring layer may be similar to that as described above in the first embodiment.

The beam profile of the laser beam L may be modified with or without the DOE 305 in the optical system. For example, in the optical system with the DOE 305 detachably arranged, firstly the optical system with the DOE 305 may be used for shaping the laser beam L to have the beam profile having the M-shaped distribution at least in the width direction for radiating it onto the substrate 10, and then the optical system with the DOE 305 removed (or without the DOE 305) may be used for shaping or not shaping the laser beam L to have the beam profile having the beam profile having the top hat distribution or the Gaussian distribution at least in the width direction for radiating it onto the substrate 10.

Also, the spot shape of the laser beam L may be modified with or without the DOE 305 in the optical system. For example, in the optical system with the DOE 305 detachably arranged, firstly the optical system with the DOE 305 may be used for shaping the laser beam L to have the rectangular beam spot for radiating it onto the substrate 10, and then then the optical system with the DOE 305 removed (or without the DOE 305) may be used for not shaping the laser beam L to have the circle beam spot or the oval beam spot for radiating it onto the substrate 10.

Since the plasma processing apparatus used for the dicing step and the plasma processing step are similar to those as discussed above in the first embodiment, duplicated descriptions therefor are eliminated herein.

REFERENCE NUMERALS

10: substrate, 10x: element chip, 11: semiconductor layer, 11A: first side, 11B: second side, 12: circuit layer, 13: resin layer, 20: conveying carrier, 21: frame, 21a: notch, 21b: corner cut, 22: supporting member, 22a: adhesive side, 22b: non-adhesive side, 40A-40D: beam spot, 41a-41d: peak intensity region, 200: plasma processing apparatus, 203: vacuum chamber, 203a: gas inlet, 203b: gas outlet, 208: dielectric member, 209: antenna, 210A: first high-frequency power source, 210B: second high-frequency power source, 211: stage, 212: processing gas source, 213: ashing gas source, 214: decompressing mechanism, 215: electrode layer, 216: metal layer, 217: base member, 218: peripheral member, 219: ESC electrode, 220: high-frequency electrode, 221: lifting rod, 222: supporting rod, 223A, 223B: lifting mechanism, 224: cover, 224W: window, 225: coolant circulation apparatus, 226: DC power source, 227: coolant channel, 228: controller, 229: circumferential ring, 301: laser oscillator, 302: zoom beam expander, 303: cylindrical lens, 304: beam bender, 305: diffractive optical element (DOE), 306: collecting lens, Rx: element region, Ry: dicing region, Ro: aperture, S; resin ball

What is claimed is:

1. A manufacturing process of an element chip, comprising:
   a preparation step for preparing a substrate including a semiconductor layer having first and second sides and a wiring layer on the first side thereof, the substrate having a plurality of dicing regions and element regions defined by the dicing regions;
   a scribing step for radiating a laser beam towards the first side of the wiring layer onto the dicing regions to form apertures exposing the semiconductor layer along the dicing regions; and
   a dicing step for dicing the substrate along the apertures into a plurality of the element chips,
   wherein the laser beam has a beam profile having a single M-shaped distribution extending over a whole width of the dicing regions, whose peripheral intensity is greater than a central intensity in a width direction of the laser beam along the dicing regions.

2. The manufacturing process according to claim 1, wherein the semiconductor layer exposed by the apertures is etched by a first plasma exposure in the dicing step.

3. The manufacturing process according to claim 1, wherein a spot shape of the laser beam is oval, elliptical or similar thereto, of which outline has a minor diameter corresponding to the width of the dicing regions.

4. The manufacturing process according to claim 1, wherein a spot shape of the laser beam is a rectangular shape having a member extending along a direction of a width of the dicing regions, or a shape similar thereto.

5. The manufacturing process according to claim 1, wherein a beam profile of the laser beam has a distribution selected from a group consisting of a Gaussian distribution and a top hat distribution along a longitudinal direction of the laser beam.

6. The manufacturing process according to claim 1, wherein the laser beam is radiated two or more times to form the apertures in the dicing regions during the scribing step.

7. The manufacturing process according to claim 1, further comprising a cleaning step for cleaning the apertures by a second plasma exposure after the scribing step, wherein the dicing step is implemented after the cleaning step.

* * * * *